United States Patent [19]

Tanaka

[11] Patent Number: 4,972,324

[45] Date of Patent: Nov. 20, 1990

[54] SEMICONDUCTOR INTEGRATED CIRCUIT WITH AN IMPROVED MACRO CELL PATTERN

[75] Inventor: Shigeru Tanaka, Fujisawa, Japan

[73] Assignee: Kabushiki Kaisha Toshiba, Kawasaki, Japan

[21] Appl. No.: 282,802

[22] Filed: Dec. 12, 1988

[30] Foreign Application Priority Data

Dec. 16, 1987 [JP] Japan .................................. 62-317860

[51] Int. Cl.⁵ .............................................. G06F 15/60
[52] U.S. Cl. ...................................... 364/491; 364/488
[58] Field of Search ................ 364/488, 489, 490, 491

[56] References Cited

U.S. PATENT DOCUMENTS 4,641,247 2/1987 Laugesen et al. ..................... 364/490
4,703,436 10/1987 Varshney ............................. 364/490

Primary Examiner—Parshotam S. Lall
Assistant Examiner—Edward R. Cosimano
Attorney, Agent, or Firm—Finnegan, Henderson, Farabow, Garrett and Dunner

[57] ABSTRACT

A semiconductor integrated circuit having a data path including k macro cells, each macro cell for processing data of different widths. Each macro cell consists of a plurality of leaves, each leaf performing data processing on one bit of data. The semiconductor integrated circuit is laid out in a rectangular pattern so that leaves of a macro cell processing $j \times n$ bit wide data are $1/j$ as wide as leaves of a macro cell executing n bit wide data.

4 Claims, 3 Drawing Sheets

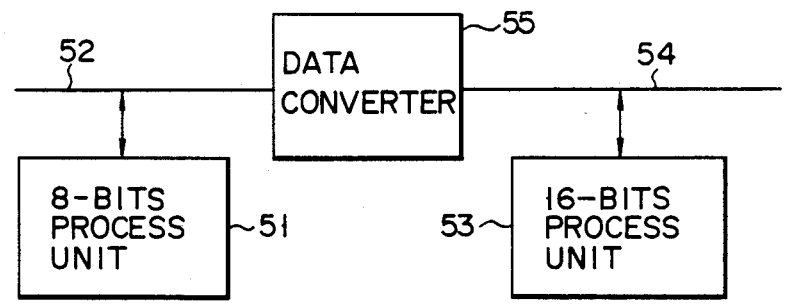
F I G. 1
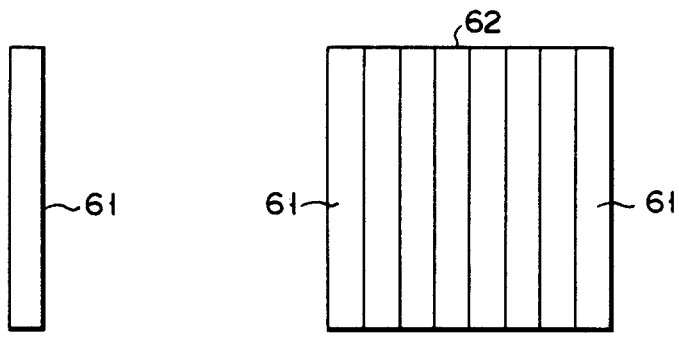
F I G. 2A   F I G. 2B
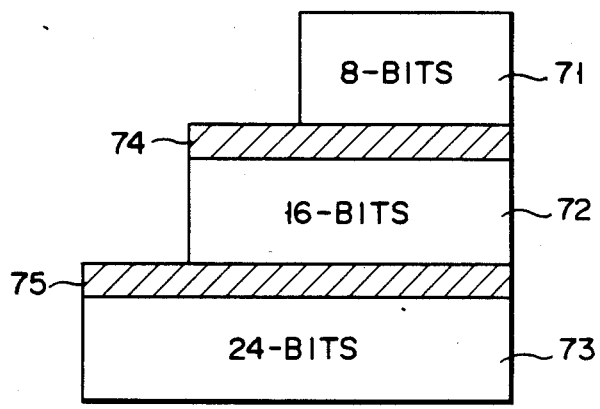
F I G. 3

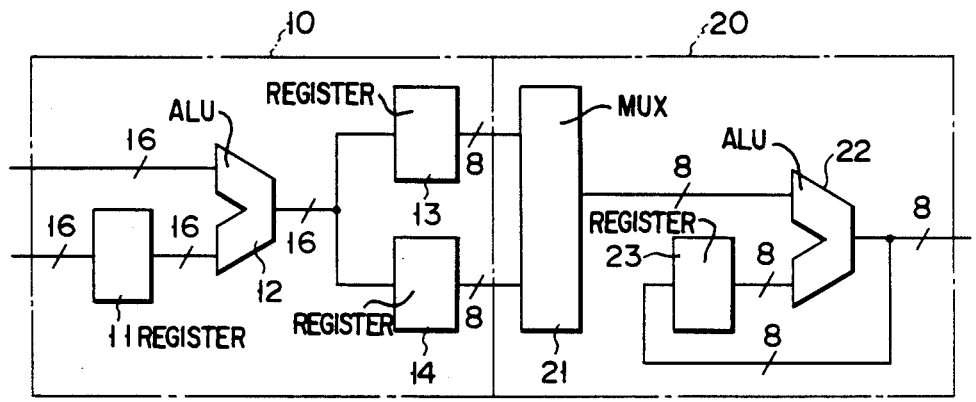
F I G. 5
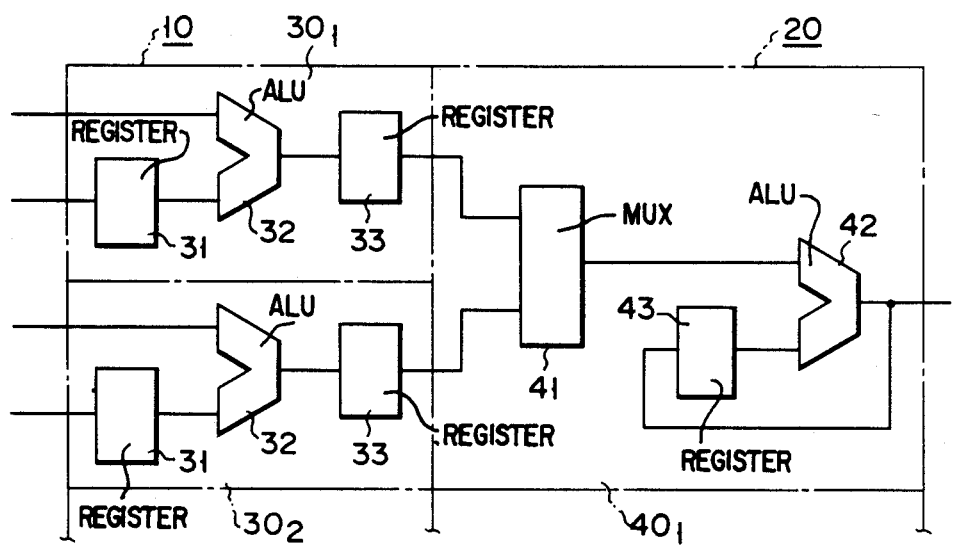
F I G. 6

SEMICONDUCTOR INTEGRATED CIRCUIT WITH AN IMPROVED MACRO CELL PATTERN

BACKGROUND OF THE INVENTION

1. Field of the Invention

The present invention relates to an semiconductor integrated circuit having an improved macro cell pattern.

2. Description of the Related Art

In general, data processing apparatuses need to deal with multifarious pieces of data a bus used for data transmission is coupled with arithmetic units and registers of various bit widths. Particularly, large scale semiconductor integrated circuits (hereinafter referred to as LSI's) often use several internal buses with different bit widths through which data exchange is effected. FIG. 1 is a block diagram illustrating one example of such a data processing apparatus. In FIG. 1, reference numeral 51 denotes an 8-bit data processor comprising an 8-bit arithmetic unit and an 8-bit register, reference numeral 52 an 8-bit data bus, reference numeral 53 a 16-bit data processor comprising a 16-bit arithmetic unit and a 16-bit register, and reference numeral 54 a 16-bit data bus. Here, 8-bit data bus 52 and 16-bit data bus 54 are coupled to a data converter 55 through which data with different bit widths are processed.

Recently, in order to effectively improve the pattern designing of an LSI, the data processor is designed using a data path block. More particularly, the pattern is designed in such a way that a 1-bit data processor has an elongated rectangular shape, and the overall data processor is basically constituted by arranging in parallel such 1-bit patterns (each being called a "leaf" hereinafter) according to the desired bit width of the bus. FIGS. 2A and 2B illustrate examples of a pattern according to the data path method; the former is a plan view of the pattern of a leaf 61 for one bit and the latter illustrates an 8-bit data processor 62 which has eight 1-bit leaves 61 of FIG. 2A arranged in parallel.

When the pattern of an apparatus including data processing apparatuses of various bit widths and buses with various bit widths is designed with the aforementioned data path method, the width of a data path as a macro cell varies depending on the bit width, so that the overall pattern of the data path will not have a rectangular shape. FIG. 3 is a plan view of the general pattern of a data path that has three data processors 71, 72 and 73 combined, which serve as macro cells having 8-bit, 16-bit and 24-bit widths. The hatched regions 74 and 75 in FIG. 3 are wiring regions where aluminum wiring for mutually coupling the data processors is formed. It should be obvious from FIG. 3 that, when the general pattern of the data path becomes complicated, it is likely to cause wastes. For example, providing a connection between other data processors is an example of a complicated data path. It is therefore difficult to provide LSI's with a high integration.

Further, due to the connection of buses or those sections having different bit widths, large wiring regions are necessary, which will hinder high integration of LSI's.

SUMMARY OF THE INVENTION

Accordingly, it is an object of this invention to provide a semiconductor integrated circuit which can design the overall data path to have a rectangular shape for a higher integration in realizing a high integration of macro cells that have data processors having various bit widths and buses having various bit widths.

A semiconductor integrated circuit embodying this invention comprises a data path including k macro cells for processing data with different data widths, each macro cell being constituted by a plurality of leaves which each performs data processing bit by bit. The semiconductor integrated circuit is laid out in a rectangular pattern so that leaves of a macro cell executing $j \times n$ bit wide data are $1/j$ as wide as leaves of a macro cell executing n bit wide data.

This particular design permits the individual macro cells constituting the data path to always have the same width and can therefore make the overall pattern of the data path to be rectangular.

In the above design, if the leaves of a macro cell having a data width of $j \times n$ bits are arranged for every j bits, a wiring region for connecting macro cells having different data widths can be made significantly small.

BRIEF DESCRIPTION OF THE DRAWINGS

FIG. 1 is a block diagram of a data processing apparatus;

FIG. 2A is a pattern plan view of a 1-bit leaf in a data path block;

FIG. 2B is a pattern plan view of a data processor with an 8-bit structure in a data path block;

FIG. 3 is a pattern plan view of a conventional data path;

FIG. 5 is a block diagram of a data processing apparatus constituted by the semiconductor integrated circuit shown in FIG. 4; and FIG. 6 is a block diagram of a data processing apparatus which is constituted by the semiconductor integrated circuit shown in FIG. 4 but has a different configuration than that of the apparatus shown in FIG. 5.

DETAILED DESCRIPTION OF THE PREFERRED EMBODIMENT

Figure 4:
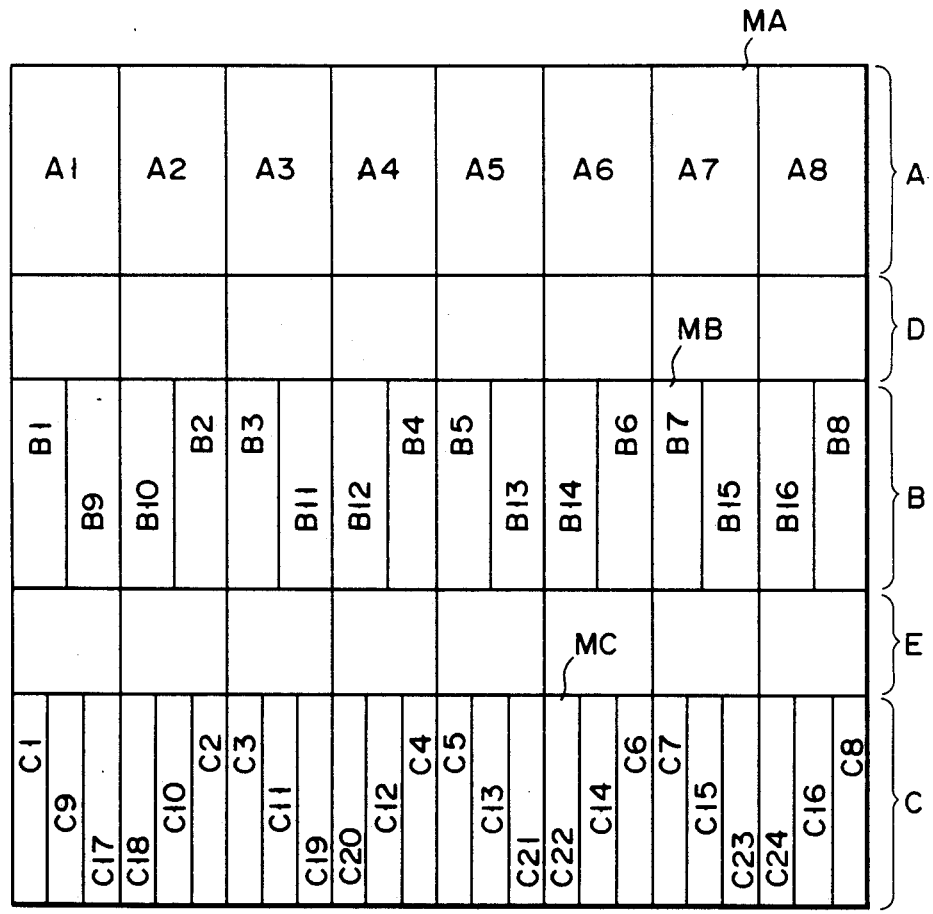
FIG. 4 is a pattern plan view illustrating the configuration of part of a semiconductor integrated circuit having an improved macro cell pattern according to this invention.

An embodiment of this invention will be described below with reference to the accompanying drawings.

FIG. 4 is a pattern plan view illustrating the configuration of part of a semiconductor integrated circuit having an improved macro cell pattern according to this invention, this circuit being installed in a semiconductor chip. In FIG. 4, a macro cell $M_A$ having a bus, data processor, register, etc., each having an 8-bit width, is arranged in a region A. In region B is provided a macro cell $M_B$ having a 16-bit bus, data processor, register, etc. Further, in region C is provided macro cell $M_C$ having a 24-bit bus, data processor, register, etc. D is a wiring region in which wiring is formed to connect regions A and B, and E is another wiring region where wiring is formed to connect regions B and C. These three macro cells and two wiring regions constitute a single data path.

Macro cell $M_A$ formed in region A has eight leaves A1 to A8 each capable of performing 1-bit data processing; the width of each leaf is set to be ⅛ of the width of the overall data path. Macro cell $M_B$ in region B has 16 leaves B1 to B16, and the width of each leaf is set to be 1/16 of the width of the overall data path. Macro cell $M_C$ in region C has 24 leaves C1 to C24, and the width of each leaf is set to be 1/24 of the width of the overall data path. In other words, the width of each leaf in macro cell $M_B$ and that in macro cell $M_C$ are respectively set to be $\frac{1}{2}$ and $\frac{1}{3}$ of the width of each leaf in macro cell $M_A$. Therefore, the width of the overall data path is the same in all the regions A, B and C, thus permitting the overall data path to be formed in a rectangular pattern. This eliminates wastes that are otherwise inevitable in realizing the connection with other data processing apparatuses which is involved at the time the present apparatus is coupled to peripheries, thus ensuring higher integration.

In addition, wiring regions D and E for connecting the individual cells can be made smaller by setting the bit arrangement of data in each macro cell in the illustrated manner. For instance, at the location of the first leaf A1 in region A are located the first bit leaf B1 and ninth bit leaf B9 in region B and the first bit leaf C1, ninth bit leaf C9 and 17-th bit leaf C17. That is, leaves which execute data processing of the 1-th bit, (1+n)-th bit, ... and (1+(j−1)n)-th bit, (where j is an integer greater than or equal to 2) should be located at the 1/n portion of a macro cell that executes data processing of (j×n)-bit data.

With the above leaf arrangement, the wiring required for transmission of 8-bit data in region A, the upper byte (bits 1-8) and lower byte (bits 9-16) of 16-bit data in region B, and the upper byte (bits 1-8), middle byte (bits 9-16) and lower byte (bits 17-24) of 24-bit data in region C between these regions A to C can be formed within the width of the leaf having 1/n of the width of the macro cell of region A. Accordingly, regions D and E can be made smaller.

A description will now be given of an application of this invention. FIG. 5 illustrates the circuit configuration of part of an LSI, which includes a macro cell 10 for performing 16-bit data processing and a macro cell 20 for performing 8-bit data processing.

The 16-bit macro cell 10 has a register 11 for storing 16-bit data, a 16-bit arithmetic and logic unit (hereinafter referred to as ALU) 12 for performing various arithmetic operations on the data stored in register 11 and other 16-bit data, and registers 13 and 14 for storing the upper and lower 8 bits of the resultant data from ALU 12. The 8-bit macro cell 20 has a multiplexer 21 for selecting the outputs of registers 13 and 14, an 8-bit ALU 22 for performing various arithmetic operations on the 8-bit data selected by multiplexer 21 and other 8-bit data, and a register 23 for storing the resultant data from ALU 22 and supplying it as the mentioned other data to the ALU 22.

In realizing integration of such macro cell 10 for performing 16-bit data processing and macro cell 20 for performing 8-bit data processing, the former macro cell 10 is constituted by 16 leaves $30_1$, $30_2$, ... and $30_{16}$, and the latter by 8 leaves $40_1$, $40_2$, ... and $40_8$. Leaves $30_2$ and $40_1$ are shown in FIG. 6. A person of ordinary skill in the art will understand that leaves $30_1$, $30_3$ through $30_{16}$, and $40_2$ through $40_8$ are arranged similarly. Each of the 16 leaves 30 in macro cell 10 comprises a 1-bit register 31, an ALU 32 for performing an arithmetic operation on 1-bit data and a 1-bit register 33 for storing output data of ALU 32. Each leaf 40 in macro cell 20 comprises a 1-bit multiplexer 41, an ALU 42 for performing an arithmetic operation on 1-bit data and a 1-bit register 43 for storing the output data of ALU 42 and feeding it back to ALU 42.

The width of each leaf 30 in macro cell 10 is set to be $\frac{1}{2}$ of the width of each leaf in macro cell 20. Accordingly, macro cell 10 has the same width as macro cell 20, thus permitting the overall pattern of the data path to be rectangular.

What is claimed is:

1. A semiconductor integrated circuit device having an improved macro cell pattern, said device comprising:
    a data path having a rectangular pattern and having a plurality of macro cells arranged in a data transmission order and formed in a semiconductor chip, each macro cell having a plurality of rectangular leaves for performing 1-bit data processing,
    wherein one of said plurality of macro cells that performs data processing of (j×n) bit wide data (j> =2) has a leaf 1/j as wide as a leaf of one of said plurality of macro cells that performs data processing of n bit wide data.

2. A device according to claim 1, wherein a macro cell that performs data processing of (j×n) bit wide data has leaves located in a 1/n region of macro cell, said leaves performing L-th bit, (L+n)-th bit, and (L+(j−1)n)-th bit data processings, where (L=1, 2, ..., n) for successive 1/n regions.

3. A device according to claim 1, wherein a total width of j leaves in said macro block which performs data processing of (j×n)-bit data is equal to said width of each leaf in said macro cell which performs data processing of n-bit data.

4. A device according to claim 3, wherein those (1+(j−1)n)-th bit data processings (1=1, 2, ..., n) are located at a 1/n region of said macro cell which performs data processing of (j×n)-bit data.

* * * * *